US007945085B2

(12) United States Patent
Luque

(10) Patent No.: US 7,945,085 B2
(45) Date of Patent: May 17, 2011

(54) USER INTERFACE FOR WAFER DATA ANALYSIS AND VISUALIZATION

(75) Inventor: Jorge Luque, Redwood City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/772,881

(22) Filed: May 3, 2010

(65) Prior Publication Data

US 2010/0211903 A1    Aug. 19, 2010

Related U.S. Application Data

(60) Division of application No. 10/452,248, filed on May 30, 2003, now Pat. No. 7,738,693, which is a continuation-in-part of application No. 10/331,194, filed on Dec. 24, 2002, now Pat. No. 7,239,737.

(51) Int. Cl.
  *G06K 9/00* (2006.01)
(52) U.S. Cl. ......... 382/145; 250/311; 348/87; 348/126
(58) Field of Classification Search ......... 382/141–152; 250/306–311, 223; 348/86–95, 125–134; 700/35–40; 715/716–726
See application file for complete search history.

(56) References Cited

U.S. PATENT DOCUMENTS

| 4,679,137 A * | 7/1987 | Lane et al. ................. 700/83 |
| 4,967,381 A * | 10/1990 | Lane et al. ................. 702/81 |
| 5,206,582 A * | 4/1993 | Ekstedt et al. ............. 324/73.1 |
| 5,226,118 A * | 7/1993 | Baker et al. ................. 715/833 |
| 5,450,205 A * | 9/1995 | Sawin et al. ................. 356/632 |
| 5,757,673 A * | 5/1998 | Osheiski et al. ............. 702/182 |
| 5,761,064 A * | 6/1998 | La et al. ................. 700/110 |
| 5,939,719 A * | 8/1999 | Park et al. ................. 850/1 |
| 6,002,740 A * | 12/1999 | Cerrina et al. ................. 378/43 |
| 6,088,712 A * | 7/2000 | Huang et al. ................. 715/201 |
| 6,128,403 A * | 10/2000 | Ozaki ................. 382/145 |
| 6,477,685 B1 * | 11/2002 | Lovelace ................. 716/4 |
| 6,597,381 B1 * | 7/2003 | Eskridge et al. ............. 715/804 |
| 6,639,417 B2 * | 10/2003 | Takao ................. 324/765 |
| 6,720,194 B1 * | 4/2004 | Miller et al. ................. 438/14 |
| 6,744,913 B1 * | 6/2004 | Guest et al. ................. 382/145 |
| 6,792,367 B2 * | 9/2004 | Hosoya et al. ................. 702/83 |
| 6,873,747 B2 * | 3/2005 | Askary ................. 382/295 |
| 2001/0000460 A1 * | 4/2001 | Ishihara et al. ............. 382/149 |
| 2001/0001015 A1 * | 5/2001 | Ishikawa et al. ............. 382/149 |
| 2001/0006558 A1 * | 7/2001 | Ohta ................. 382/145 |
| 2002/0051565 A1 * | 5/2002 | Hiroi et al. ................. 382/149 |
| 2002/0102747 A1 * | 8/2002 | Muradian et al. ............. 438/14 |
| 2002/0114506 A1 * | 8/2002 | Hiroi et al. ................. 382/149 |
| 2002/0196969 A1 * | 12/2002 | Behkami et al. ............. 382/149 |
| 2003/0014205 A1 * | 1/2003 | Tabor ................. 702/84 |
| 2003/0061212 A1 * | 3/2003 | Smith et al. ................. 707/6 |
| 2003/0067496 A1 * | 4/2003 | Tasker et al. ................. 345/846 |
| 2003/0109070 A1 * | 6/2003 | Hosoya et al. ................. 438/14 |
| 2003/0109952 A1 * | 6/2003 | Hosoya et al. ................. 700/110 |
| 2003/0164942 A1 * | 9/2003 | Take ................. 356/237.2 |
| 2003/0232396 A1 * | 12/2003 | Mathew et al. ................. 435/7.2 |

(Continued)

*Primary Examiner* — Aaron W Carter
(74) *Attorney, Agent, or Firm* — Martine Penilla & Gencarella, LLP

(57) ABSTRACT

A wafer viewer system is provided for graphical presentation and analysis of a wafer and a wafer series. More specifically, the wafer viewer system includes a graphical user interface for displaying a wafer, graphically selecting regions of the wafer for analysis, performing analysis on the selected regions of the wafer, and displaying results of the analysis.

12 Claims, 15 Drawing Sheets

U.S. PATENT DOCUMENTS

| | | | |
|---|---|---|---|
| 2004/0031779 A1* | 2/2004 | Cahill et al. | 219/121.83 |
| 2004/0122605 A1* | 6/2004 | Miyazaki | 702/57 |
| 2005/0006583 A1* | 1/2005 | Nozoe et al. | 250/311 |
| 2005/0047645 A1* | 3/2005 | Funk et al. | 382/145 |
| 2005/0165731 A1* | 7/2005 | Funk | 707/1 |
| 2005/0188309 A1* | 8/2005 | Tasker et al. | 715/700 |
| 2006/0002606 A1* | 1/2006 | Do | 382/145 |
| 2006/0239536 A1* | 10/2006 | Shibuya et al. | 382/149 |
| 2007/0023658 A1* | 2/2007 | Nozoe et al. | 250/310 |
| 2007/0067131 A1* | 3/2007 | Teshima et al. | 702/118 |
| 2008/0097621 A1* | 4/2008 | Tasker et al. | 700/1 |
| 2010/0138028 A1* | 6/2010 | Tasker et al. | 700/117 |

* cited by examiner

Wafer data
Wafer size 200 ▼ mm    ☐ Allow adding new sites

| Site | x (mm) | y (mm) | z (nm) |
|---|---|---|---|
| 1 | .000 | .000 | 110.39 |
| 2 | .000 | 31.667 | 110.37 |
| 3 | -22.392 | 22.392 | 110.40 |
| 4 | -31.667 | .000 | 110.26 |
| 5 | -22.392 | -22.392 | 110.22 |
| 6 | .000 | -31.667 | 110.41 |
| 7 | 22.392 | -22.392 | 110.46 |
| 8 | 31.667 | .000 | 110.41 |
| 9 | 22.392 | 22.392 | 110.39 |
| 10 | .000 | 63.333 | 110.48 |
| 11 | -24.237 | 58.512 | 110.17 |
| 12 | -44.783 | 44.783 | 110.14 |
| 13 | -58.512 | 24.237 | 110.02 |
| 14 | -63.333 | .000 | 110.79 |
| 15 | -58.512 | -24.237 | 110.78 |
| 16 | -44.783 | -44.783 | 110.89 |
| 17 | -24.237 | -58.512 | 110.10 |
| 18 | .000 | -63.333 | 110.22 |
| 19 | 24.237 | -58.512 | 110.43 |
| 20 | 44.783 | -44.783 | 110.38 |
| 21 | 58.512 | -24.237 | 110.31 |
| 22 | 63.333 | .000 | 110.16 |
| 23 | 58.512 | 24.237 | 110.11 |
| 24 | 44.783 | 44.783 | 110.08 |
| 25 | 24.237 | 58.512 | 110.12 |
| 26 | .000 | 95.000 | 109.62 |
| 27 | -24.588 | 91.763 | 109.54 |
| 28 | -47.500 | 82.272 | 109.38 |
| 29 | -67.175 | 67.175 | 108.72 |
| 30 | -82.272 | 47.500 | 108.85 |
| 31 | -91.763 | 24.588 | 108.91 |
| 32 | -95.000 | .000 | 108.75 |

FIG. 3

USER INTERFACE FOR WAFER DATA ANALYSIS AND VISUALIZATION

CLAIM OF PRIORITY

This is a divisional application of prior U.S. application Ser. No. 10/452,248, filed on May 30, 2003, entitled "User Interface for Wafer Data Analysis and Visualization," issued as U.S. Pat. No. 7,738,693, which is a continuation-in-part of prior U.S. application Ser. No. 10/331,194, filed Dec. 24, 2002, entitled "User Interface for Quantifying Wafer Non-Uniformities and Graphically Explore Significance," issued as U.S. Pat. No. 7,239,737. The disclosure of each above-identified application is incorporated in its entirety herein by reference.

CROSS-REFERENCE TO RELATED APPLICATIONS

This application is also related to U.S. patent application Ser. No. 10/327,233, filed Dec. 20, 2002, and entitled "System and Method for Quantifying Unifoimity Patterns for tool Development and Monitoring," issued as U.S. Pat. No. 6,922,603, the disclosure of which is incorporated herein by reference.

BACKGROUND OF THE INVENTION

1. Field of the Invention

The present invention relates generally to post-process wafer evaluation. More specifically, the present invention relates to a system for enabling graphical presentation and control of a post-process wafer evaluation.

2. Description of the Related Art

Semiconductor wafers undergo numerous processes during the semiconductor manufacturing process. Layers may be added, patterned, etched, removed, and polished, among others. After each process the wafer is typically examined to confirm the previous process was completed with an acceptable level of post-process error or nonuniformity. The various operating variables (e.g., event timing, gas pressure, concentrations, temperatures, etc. ... ) of each process performed on the wafer are recorded so that any changes in any variable may be quickly identified and potentially correlated to any post-process error or nonuniformity discovered when the wafer is examined.

Prior art approaches to describing post-process nonuniformities include subjective, verbal descriptions such as "center-fast" for annular nonuniformity or "left-side-slow" for azimuthal nonuniformity. Center-fast is generally descriptive of a post-process wafer condition where more material has been removed from a center region on the wafer than from a surrounding region on the wafer. However, center-fast does not provide a specific, objective, and quantitative description of the nonuniformity. Similarly, left-side-slow is generally descriptive of a post-process wafer condition where less material has been removed from a left side region on the wafer than from a remaining region on the wafer. As with the center-fast description, the left-side-slow description fails to provide a specific, objective, and quantitative description of the nonuniformity.

Descriptions of post-process nonuniformities are used to provide feedback to correct errors and inconsistencies in the preceding wafer processes. Descriptions of post-process non-uniformities can also be used to track the impact of the non-uniformities on subsequent semiconductor manufacturing processes and on metrics from completed semiconductor devices (e.g., device yields, performance parameters, etc. ... ).

As post-process nonuniformities become smaller and smaller, the post-process nonuniformities become less symmetrical and more difficult to accurately describe with the subjective, verbal descriptions. In following, the subjective, verbal descriptions are insufficient to accurately describe the post-process nonuniformities so that further improvements in the preceding wafer processing operations can be successfully implemented.

In view of the foregoing, there is a need for a system that enables a detailed graphical display and analysis of a post-process wafer condition.

SUMMARY OF THE INVENTION

Broadly speaking, the present invention fills these needs by providing a wafer viewer system for graphical presentation and analysis of a wafer. More specifically, the wafer viewer system includes a graphical user interface for displaying a wafer, graphically selecting regions of the wafer for analysis, performing analysis on the selected regions of the wafer, and displaying results of the analysis.

In one embodiment, a graphical user interface for analyzing wafer measurement data is disclosed. The graphical user interface provides controls for selecting a first set of wafer measurement data and a second set of wafer measurement data. The graphical user interface also provides a control for performing a mathematical operation between the first set of wafer measurement data and the second set of wafer measurement data. The mathematical operation creates a result set of wafer data. The graphical user interface further includes displaying the result set of wafer data.

In another embodiment, a graphical user interface for managing and evaluating a collection of wafer measurement data is disclosed. The graphical user interface provides a control for selecting the collection of wafer measurement data. The graphical user interface also provides a control for performing an evaluation of the collection of wafer measurement data to create a set of evaluation results. The graphical user interface further includes displaying the set of evaluation results.

In another embodiment, a computer implemented process for controlling and performing analysis of wafer measurement data is disclosed. The computer implemented process includes providing a graphical user interface. The graphical user interface provides a control for selecting a subset of the wafer measurement data for analysis. The computer implemented process further includes performing analysis of the subset of the wafer measurement data to create a set of analysis results. A display of the analysis results is provided by the computer implemented process in the graphical user interface.

In another embodiment, a graphical user interface for performing a profile analysis is disclosed. The graphical user interface includes displaying a wafer image. Controls for adjusting the wafer image are provided. Also, the graphical user interface provides a graphical measurement control.

In another embodiment, a computer readable media containing program instructions for controlling and performing analysis of wafer measurement data is disclosed. The computer readable media includes program instructions for providing a graphical user interface. The graphical user interface provides a control for selecting a subset of the wafer measurement data for analysis. The computer readable media further includes program instructions for performing analysis of the subset of the wafer measurement data to create a set of analysis results. The computer readable media also includes program instructions for providing a display of the analysis results in the graphical user interface.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which:

FIG. 3 is an illustration showing an isolated view of the wafer data area, in accordance with one embodiment of the present invention;

DETAILED DESCRIPTION OF THE PREFERRED EMBODIMENTS

Broadly speaking, an invention is disclosed for a wafer viewer system for graphical presentation and analysis of a wafer. More specifically, the wafer viewer system includes a graphical user interface for displaying a wafer, graphically selecting regions of the wafer for analysis, performing analysis on the selected regions of the wafer, and displaying results of the analysis.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
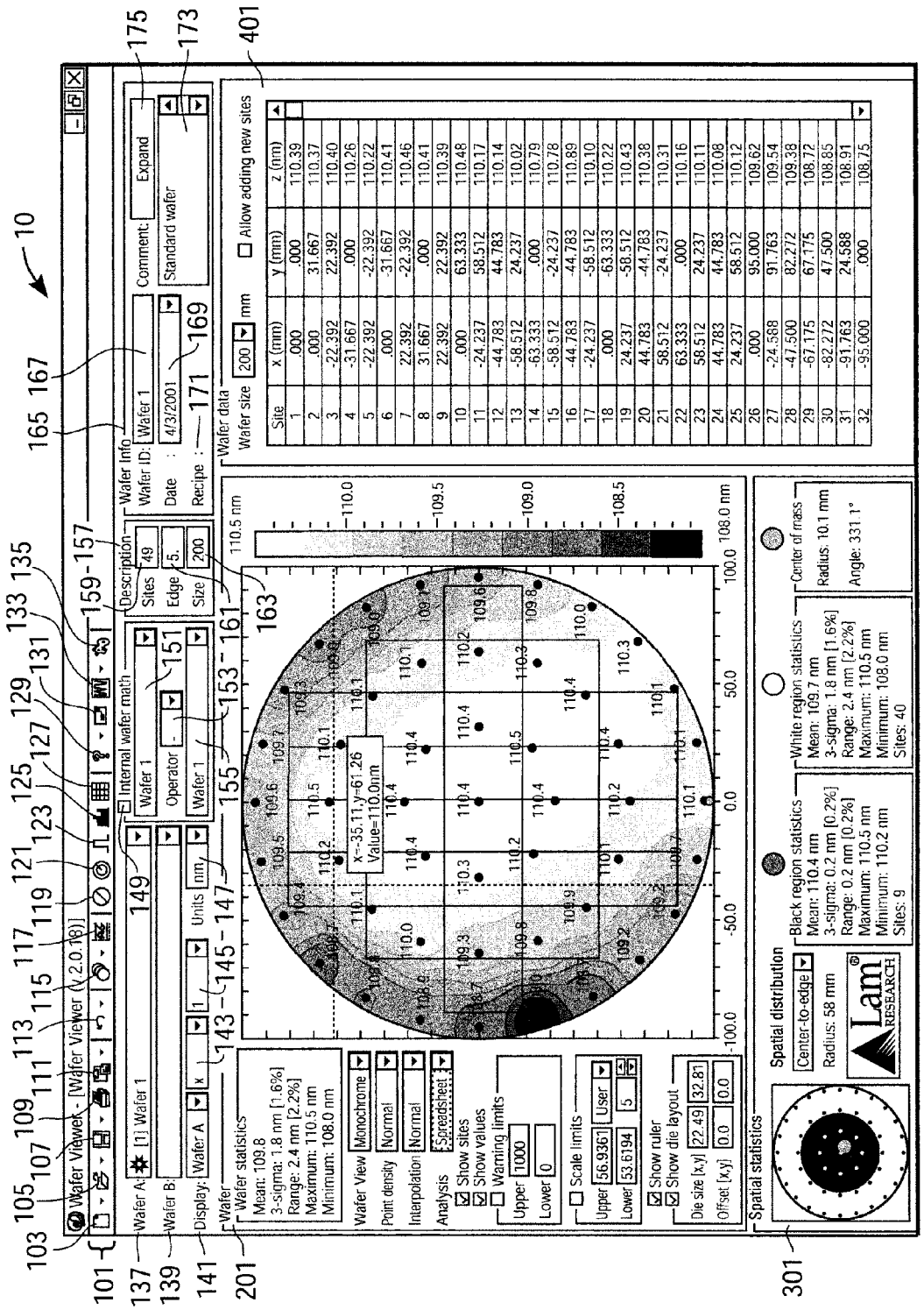
FIG. 1 is an illustration showing a graphical user interface (GUI) of a wafer viewer system, in accordance with one embodiment of the present invention.

FIG. 1 is an illustration showing a graphical user interface (GUI) 10 of a wafer viewer system, in accordance with one embodiment of the present invention. The GUI 10 includes a menu bar 101 having a number of user-activatable icons which can be activated to perform a number of tasks.

A clear wafers/XSEM icon 103 is provided to allow a user to either clear a wafer or an XSEM/TEM image that is currently loaded in the wafer viewer. The clear wafers/XSEM icon 103 offers a drop-down menu for presenting the clear wafer and clear XSEM/TEM options.

A load data/XSEM icon 105 is provided to allow a user to load data for either a Wafer A, a Wafer B, or an XSEM/TEM image. The load data/XSEM icon 105 offers a drop-down menu for presenting the Wafer A, the Wafer B, or the XSEM/TEM image options for loading data. In one embodiment, the wafer viewer is capable of reading output files from metrology tools without intermediate processing. In this embodiment, the wafer viewer recognizes file formats by an associated file extension. For example, output files from metrology tools such as Hitachi CD SEM, KLA-Tencor CD SEM, Optiprobe ellipsometer, Rudolph ellipsometer, F5x KLA-Tencor (ellipsometry and scatterometry formats), and NOVA scatterometer are recognizable by the wafer viewer. Also, the wafer viewer is capable of loading a user defined file. In addition to loading data for individual wafers and XSEM/TEM images, the wafer viewer also supports loading files containing data for either individual or multiple wafers having multiple layers or measurements for a given wafer.

A save data icon 107 is provided to allow a user to save numerical data corresponding to a currently displayed wafer. In one embodiment, the save data icon 107 offers a drop-down menu for presenting options for saving either wafer data, diameter data, or optical profile data.

A print icon 109 is provided to allow a user to print a wafer report. In one embodiment, the wafer report includes a header (containing wafer names, date, number of sites, etc. . . . ), a set of wafer statistics (mean, 3-sigma, range, maximum, minimum), a wafer map currently displayed by the wafer viewer, a set of cross-section statistics (mean, 3-sigma, range, maximum, minimum), and a cross-section graph currently displayed by the wafer viewer.

A copy to clipboard icon 111 is provided to allow a user to copy information to a virtual clipboard for transfer to other applications. In one embodiment, the copy to clipboard icon 111 offers a drop-down menu for presenting various information options that can be copied to the virtual clipboard. For example, in one embodiment, the drop-down menu can include a Map, Scale, and Statistics option, a Wafer Map option, a Color Scale option, a Diameter option, a Radial Graph option, an Azimuthal Graph option, and a XSEM/Optical Profile Picture option.

An undelete wafer site icon 113 is provided to allow a user to undelete a previously deleted wafer site. In one embodiment, the undelete wafer site icon 113 offers a drop-down menu for presenting a last point option and an all points option. Selection of the last point option will undelete the last wafer site that was deleted. Selection of the all points option will undelete all of the previously deleted wafer sites.

A wafer collection management icon 115 is provided to allow a user to create and manage a wafer collection. The wafer collection represents a collection of multiple data sets for a number of wafers that have a common pattern of data measurement sites ("sites"). In addition to data sets, the wafer collection also includes associated wafer identifiers, dates, and comments. In one embodiment, the number of wafers in the wafer collection can have differing patterns of sites. However, in this embodiment, a first wafer in the wafer collection will determine a master site pattern for the entire wafer collection. In following, the remaining wafers in the wafer collection will have their data interpolated to match the master site pattern. For example, if a wafer with a deleted site is added to a wafer collection, a data value is interpolated for the deleted site. Additionally, this embodiment avoids problems associated with an analysis of a wafer collection that includes wafers having different edge exclusion areas and/or measurement data from different metrology tools (i.e., have a different measurement site pattern).

In one embodiment, the wafer collection management icon 115 offers a drop-down menu for presenting a number of wafer collection management options. Options are included for adding a wafer to a collection, deleting a wafer from a collection, making a collection from a wafer lot, making a collection from all wafer lot properties, inserting a wafer in a collection, and saving changes to a wafer collection. The option for making a collection from a wafer lot allows a user to create a wafer collection from a file containing a common type of data for multiple wafers. The option for making a collection from all wafer lot properties allows a user to simultaneously create multiple wafer collections from a file containing a number of types of data for multiple wafers. A separate wafer collection will be created for each of the number of types of data. Each of the separate wafer collections will contain the corresponding data for each of the multiple wafers.

A help icon 129 is provided to allow a user to obtain assistance with operation of the GUI 10. In one embodiment, the help icon 129 offers a drop-down menu for presenting options to either obtain general help or obtain help with file input formats.

An email technical support icon 131 is provided to allow a user to send an email to a designated GUI 10 technical support email address. Activation of the email technical support icon 131 automatically instantiates an new email preparation feature of an email program resident on a host computer system.

An about icon 133 is provided to allow a user to obtain information about the wafer viewer system. In one embodiment, the about icon 133 offers a drop-down menu for presenting options to either obtain information regarding the wafer viewer system or visit a wafer viewer system website. Selection of the option to visit the wafer viewer system website automatically instantiates a web browser resident on the host computer system and navigates to a predesignated wafer viewer system web page.

A registration icon 135 is provided to allow a user to register a wafer viewer system. In one embodiment, registration of the wafer viewer system is used as a security feature to control distribution and installation of the wafer viewer system on the host computer system.

In addition to the aforementioned user-activatable icons, menu bar 101 also includes a series analysis icon 117, a diameter/histogram icon 119, an azimuthal/radial distribution icon 121, an XSEM/profile icon 123, a histogram icon 125, and a wafer spreadsheet icon 127. These additional user-activatable icons will be discussed below in connection with their corresponding wafer viewer system feature.

The GUI 10 further includes a first wafer identification and selection field 137 and a second wafer identification and selection field 139. Each of the first and second wafer identification and selection fields, 137 and 139, displays a name corresponding to a wafer data set currently loaded for a Wafer A and a Wafer B, respectively. Additionally, each of the first and second wafer identification and selection fields, 137 and 139, offers a drop-down menu for selecting an available wafer data set to be loaded for the Wafer A and the Wafer B, respectively.

The GUI 10 further includes a display control field 141 to allow the user to select a wafer data set to be displayed and analyzed by the wafer viewer system. In one embodiment, the display control field 141 offers a drop-down menu for presenting options of different wafer data sets to be selected for display and analysis. For example, the drop-down menu can include options for Wafer A, Wafer B, (Wafer A−Wafer B), (Wafer A+Wafer B), (Wafer A×Wafer B), (Wafer A/Wafer B), and [(1/Wafer A)−(1/Wafer B)], among others. The option selected will determine the wafer data that is currently displayed and analyzed by the wafer viewer system.

In addition, through the use of an operator field 143 and an operand field 145, further mathematical operations can also be performed on the wafer data selected in the display control field 141. The operator field 143 offers a drop-down menu for presenting a multiplication (x), an addition (+), a subtraction (−), a division (/), a power (^), and a rotate operation to be performed on the wafer data that is selected in the display control field 141. The operand field 145 offers a drop-down menu for allowing the user to select either a number, a mean, or a minimum operand option. Selection of the number operand option allows the user to enter a number in the operand field 145 to be used as an operand. Selection of the mean operand option will cause the mean value of the wafer data selected in the display control field 141 to be used as the operand. Selection of the minimum operand option will cause the minimum value of the wafer data selected in the display control field 141 to be used as the operand. The mathematical operation indicated in the operator field 143 (i.e., x, +, −, /, or ^) will be performed on the wafer data selected in the display control field 141 using the operand entered in the operand field 145. Data resulting from the mathematical operation will be used by the wafer viewer system for display and analysis. In the case where the rotate option is selected in the operator field 143, the operand entered in the operand field 145 will be used as a number of degrees of rotation for display of the wafer data currently selected.

The GUI 10 further includes a units field 147 to allow the user to select a unit of measure to be associated with the wafer data currently displayed and analyzed by the wafer viewer system. In one embodiment, available units of measure include Angstrom, nanometer, kiloAngstrom, micrometer, Celsius, Angstrom/minute, nanometer/minute, kiloAngstrom/minute, micrometer/minute, and none. The units field 147 offers a drop-down menu for presenting the various unit of measure options available for selection.

As previously mentioned, data can be loaded for multiple layers or measurements for a given wafer. For these cases, the GUI 10 includes an internal wafer math selection 149. When selected, the internal wafer math selection 149 causes a mathematical operation to be performed between selected layer or measurement data sets for the given wafer. A first internal math operand field 151 offers a drop-down menu for allowing the user to select a data set to be used as a first operand in the internal wafer math calculation. A second internal math operand field 155 offers a drop-down menu for allowing the user to select a data set to be used as a second operand in the internal wafer math calculation. An internal math operator field 153 offers a drop-down menu for allowing the user to select the internal math operation to be performed (i.e., subtraction (−), addition (+), multiplication (x), or division (/). The selected internal math operation is performed between corresponding data values of the selected first and second internal math operands. Data resulting from the selected internal math operation will be used by the wafer viewer system for display and analysis.

The GUI 10 further includes a wafer description area 157. In one embodiment, the wafer description area 157 includes a sites field 159, an edge field 161, and a size field 163. The sites field 159 provides information about the number of data measurement sites in the currently displayed and analyzed wafer or wafers. The edge field 161 provides a size of an edge exclusion zone of the currently displayed and analyzed wafer or wafers. The size field 163 provides a diameter size of the currently displayed and analyzed wafer or wafers.

The GUI 10 further includes a wafer information area 165. In one embodiment, the wafer information area 165 includes a wafer identifier field 167, a date field 169, a recipe field 171, and a comment field 173. The wafer identifier field 167 displays an identifier associated with the currently displayed and analyzed wafer. The date field 169 displays a date on which the currently loaded wafer data was created or obtained. The date field 169 also offers a drop-down control that when activated causes a navigatable calendar to be displayed. The recipe field 171 displays information regarding a wafer processing recipe associated with the currently loaded wafer data. The comment field 173 displays comments provided with the currently loaded wafer data. The comment field 173 is equipped with vertical scroll controls. An expand icon 175 is also associated with the comment field 173. When activated, the expand icon 175 causes the comment field 173 to be displayed in a larger pop-up window. The larger pop-up window offers a close icon that can be activated to close the pop-up window.

The GUI 10 further includes a wafer display area 201 and a spatial statistics area 301. A remaining portion of the GUI is used to display features associated with a currently selected analysis mode. For example, in FIG. 1, the currently selected analysis mode is spreadsheet. Therefore, the remaining portion of the GUI is used to display a wafer data area 401 associated with the spreadsheet analysis mode. The wafer data area 401 and other available analysis mode selections and associated features will be described in more detail below.

Figure 2:
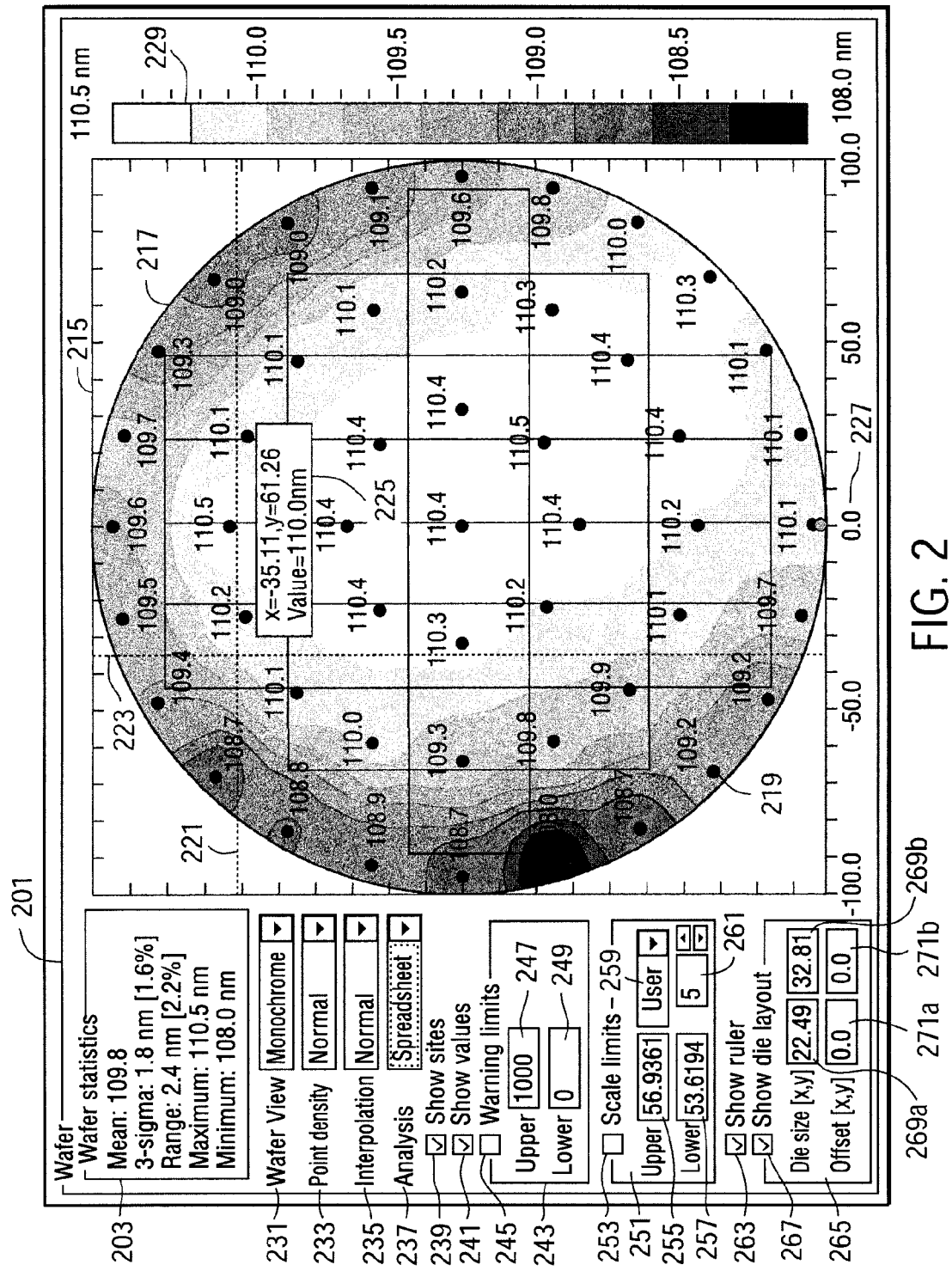
FIG. 2 is an illustration showing an isolated view of the wafer display area, in accordance with one embodiment of the present invention.

FIG. 2 is an illustration showing an isolated view of the wafer display area 201, in accordance with one embodiment of the present invention. The wafer display area 201 includes a wafer display window 215. A cartesian coordinates system is defined within the wafer display window 215. An origin of the cartesian coordinates system is positioned at the center of the wafer display window 215.

A wafer image 217 is displayed within the wafer display window 215. The wafer image 217 is centered at the origin of the cartesian coordinate system defined within the wafer display window 215. The wafer image 217 includes a display of actual data measurement site locations 219 and an associated measurement data value. The wafer image 217 also includes a color or monochrome map rendered by numerical interpolation between the data measurements. As the user moves a mouse over the wafer image 217, a vertical guide 223, a horizontal guide 221, and a information box 225 are displayed at the mouse location. The information box 225 displays a set of cartesian coordinates and a data value corresponding to the mouse location. The vertical guide 223 and horizontal guide 221 can be used in combination with a scale 227 provided at the lower edge of the wafer display window 215 to accurately position the mouse at a desired location.

The wafer display area 201 also includes a color scale 229 corresponding to the various hues or shades utilized in the color or monochrome map displayed across the wafer image 217. According to the color scale 229 a change in color or shade corresponds to a change in data value magnitude.

A wafer view select field 231 is provided within the wafer display area 201. The wafer view select field 231 offers a drop-down menu for presenting wafer display options. In one embodiment, the wafer display options include color contour, color gradient, monochrome, 1-sigma, and sites value. The color contour option divides the color scale 229 into a discrete number of steps. In one embodiment, the color contour option divides the color scale into 9 discrete steps. The color contour option is useful for showing wafer regions with similar values. The color gradient option defines the color scale 229 using a continuous gradient. The color gradient option is useful for providing more detail than the color contour option. The monochrome option defines the color scale 229 as a gray scale. The monochrome option is useful for providing the wafer image 217 in a format that is more compatible with black and white printers. The 1-sigma option displays data values below 1-sigma in a first color, data values within plus or minus 1-sigma in a second color, and data values above 1-sigma in a third color. The 1-sigma option is useful for displaying data values that are far from average. The sites value option only displays the actual data measurement site locations 219 and associated measurement data values.

A point density select field 233 is provided within the wafer display area 201. The point density select field 233 offers a drop-down menu for presenting point density options for use in defining an interpolation grid. In one embodiment, the point density options include low (50 point by 50 point interpolation grid), normal (100 point by 100 point interpolation grid, and high (200 point by 200 point interpolation grid). For example, selection of the low option will cause the interpolation grid to be defined within the wafer display window 215 with 50 uniform width columns and 50 uniform height rows. Selection of the normal option will cause the interpolation grid to be defined within the wafer display window 215 with 100 uniform width columns and 100 uniform height rows. Selection of the high option will cause the interpolation grid to be defined within the wafer display window 215 with 200 uniform width columns and 200 uniform height rows. A data value is interpolated for each point in the defined interpolation grid. Thus, selection of the high option provides the highest interpolation resolution, and selection of the low option provides the lowest interpolation resolution.

An interpolation select field 235 is provided within the wafer display area 201. The interpolation select field 233 offers a drop-down menu for presenting interpolation options for use in calculating the interpolated data values for display in accordance with the selected interpolation grid. In one embodiment, the interpolation options include soft, normal, and harsh. The interpolation is based on an inverse distance algorithm which generates a weight function that is proportional to $(1/r^n)$, where r is the distance between a data measurement site location 219 and a location to be interpolated and n is an adjustable parameter with an optimum value between 2 and 4. A higher n value is better for fewer data measurement site locations. Conversely, a lower n value is better for more data measurement locations. The soft option sets the n value equal to 2. The harsh option sets the n value equal to 4. The normal option calculates an n value according to a number of displayed data measurement locations.

A show sites selection 239 is provided within the wafer display area 201. The show sites selection 239 can be toggled to display and remove the data measurement site locations 219 from the wafer image 217.

A show values selection 241 is provided within the wafer display area 201. The show values selection 241 can be toggled to display and remove the data values associated with the data measurement site locations 219 from the wafer image 217.

A show ruler selection 263 is provided within the wafer display area 201. The show ruler selection 263 can be toggled to display and remove ruler tick marks from the sides of the wafer display window 215.

A warning limits area 243 is provided within the wafer display area 201. The warning limits area 243 includes a warning limits activation selection 245, an upper warning limit field 247, and a lower warning limit field 249. When the warning limits activation selection 245 is activated, each data measurement site location 219 having an associated data value that is either above the upper warning limit field 247 value or below the lower warning limit field value 249 is highlighted in the wafer image 217.

A scale limits area 251 is provided within the wafer display area 201. The scale limits area 251 includes a scale limits activation selection 253 and a drop-down menu 259 offering options for establishing an upper and a lower scale limit. The drop-down menu 259 includes a user supplied option, a percentage of mean option, and a 3-sigma option. Selection of the user supplied option enables an upper scale limit to be entered in an upper scale limit field 255 and a lower scale limit to be entered in a lower scale limit field 257. Selection of the percentage of mean option enables a percentage value to be entered in a value field 261. The upper and lower scale limits are calculated to be a corresponding percentage of the mean. Selection of the 3-sigma option establishes the upper and lower scale limits at three times the standard deviation about the mean.

A die layout area 265 is provided within the wafer display area 201. The die layout area 265 includes a show die layout selection 267, a horizontal die size field 269a, a vertical die size field 269b, a horizontal die offset field 271a, and a vertical die offset field 271b. The horizontal die size field 269a and the vertical die size field 269b allow the user to provide dimensions of a single die. The horizontal die offset field 271a and the vertical die offset field 271b allow the user to provide a die grid offset relative to a center of the wafer.

The wafer display area 201 also includes a wafer statistics area 203. The wafer statistics area 203 displays a mean value 205, a 3-sigma value 207 (i.e., three times the standard deviation about the mean), a range value 209 (i.e., difference between the maximum value and the minimum value), a maximum value 211, and a minimum value 213, corresponding to a set of currently displayed wafer data.

The wafer display area 201 further includes an analysis select field 237. The analysis select field 237 offers a drop-down menu for presenting analysis mode options. In one embodiment, the analysis mode options include a cross-section analysis option, a distribution analysis option, an XSEM/Profile analysis option, and a spreadsheet analysis option. Selection of an analysis option causes a set of corresponding features and controls to be displayed within the GUI 10. Features and controls associated with each of the analysis mode options are described below with respect to FIGS. 3 through 13.

In FIG. 2, the analysis select field 237 indicates that the spreadsheet analysis option is selected. Referring back to FIG. 1, the wafer data area 401 is displayed upon selection of the spreadsheet analysis option. In addition to using the analysis select field 237, the spreadsheet analysis option can also be selected by activating the wafer spreadsheet icon 127 in the menu bar 101.

FIG. 3 is an illustration showing an isolated view of the wafer data area 401, in accordance with one embodiment of the present invention. The wafer data area 401 includes a spreadsheet display. The spreadsheet display includes a site column 407 for entering and/or displaying a number of a data measurement site. An x-column 409 and a y-column 411 are included for entering and/or displaying x and y cartesian coordinates, respectively, of the corresponding data measurement site. A z-column 413 is included for entering and/or displaying a wafer thickness corresponding to the data measurement site. Data is entered and/or displayed for each data measurement site on a separate row. The user can select a header of either the site column 407, the x-column 409, the y-column 411, or the z-column 413 to sort the data in the spreadsheet display by the data in the respective column. Successive selections of a particular header will toggle the sort between ascending and descending order. A vertical scroll control is provided to allow navigation through the spreadsheet display. Also, an allow adding new sites selection 405 is provided. Activation of the allow adding new sites selection 405 allows the user to manually enter data for a new data measurement site in the spreadsheet display. If the allow adding new sites selection 405 is not activated, the user is not able to enter or change data in the spreadsheet display. Thus, the spreadsheet analysis option allows the user to edit data of an existing wafer or enter data for a new wafer.

The wafer data area 401 also includes a wafer size select field 403 offering a drop-down menu for presenting wafer size options. In one embodiment, the wafer size options include 75 mm, 100 mm, 125 mm, 150 mm, 200 mm, 300 mm, and 450 mm diameter wafers. Selection of a particular wafer size option adjusts the scale 227 provided at the lower edge of the wafer display window 215.

Figure 4:
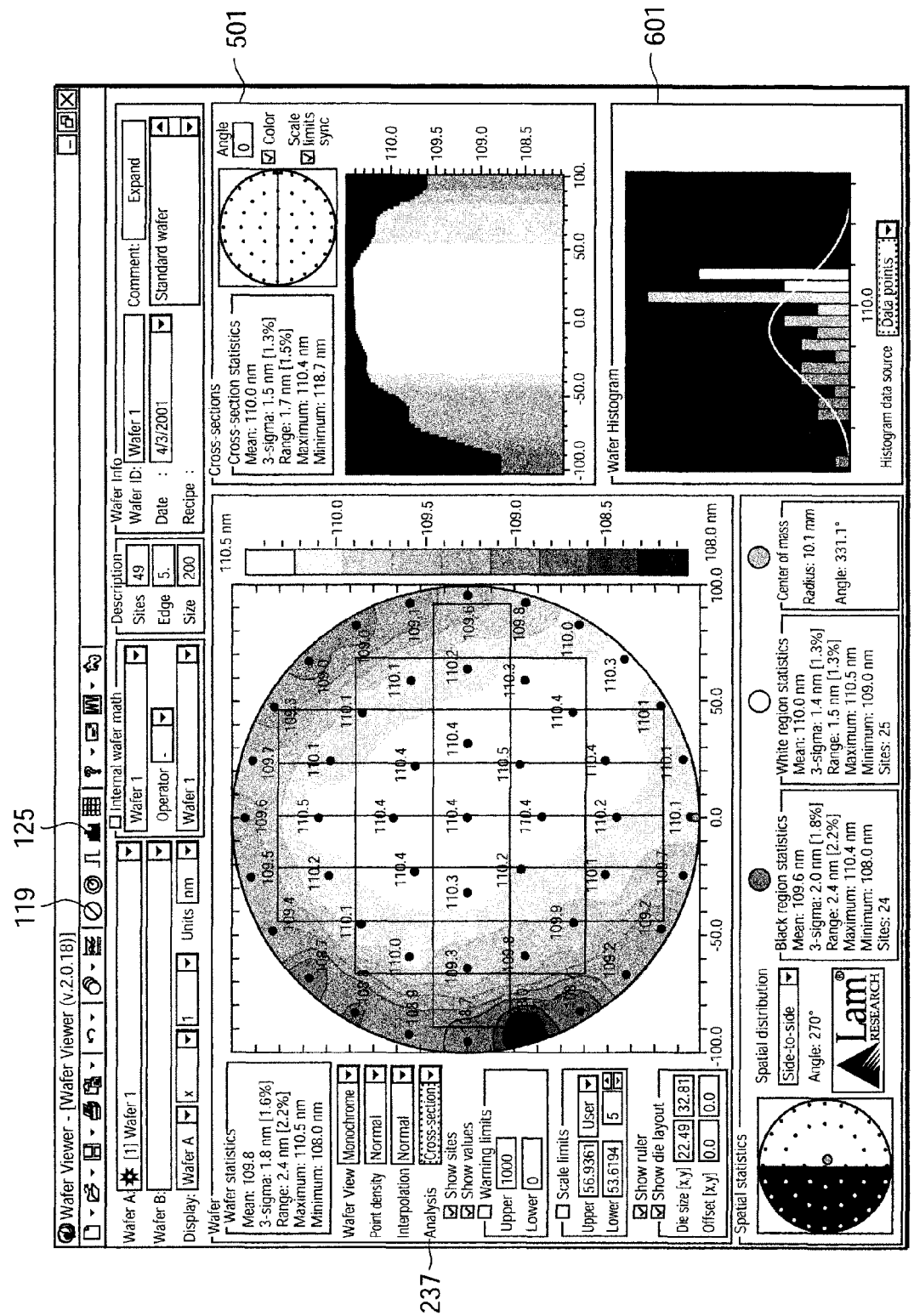
FIG. 4 is an illustration showing the GUI when the cross-section analysis option is selected, in accordance with one embodiment of the present invention.

FIG. 4 is an illustration showing the GUI 10 when the cross-section analysis option is selected, in accordance with one embodiment of the present invention. The cross-section analysis option can be selected with either the analysis select field 237, the diameter/histogram icon 119, or the histogram icon 125. Upon selection of the cross-section analysis option, the GUI 10 displays a cross-section area 501 and a histogram area 601.

Figure 5:
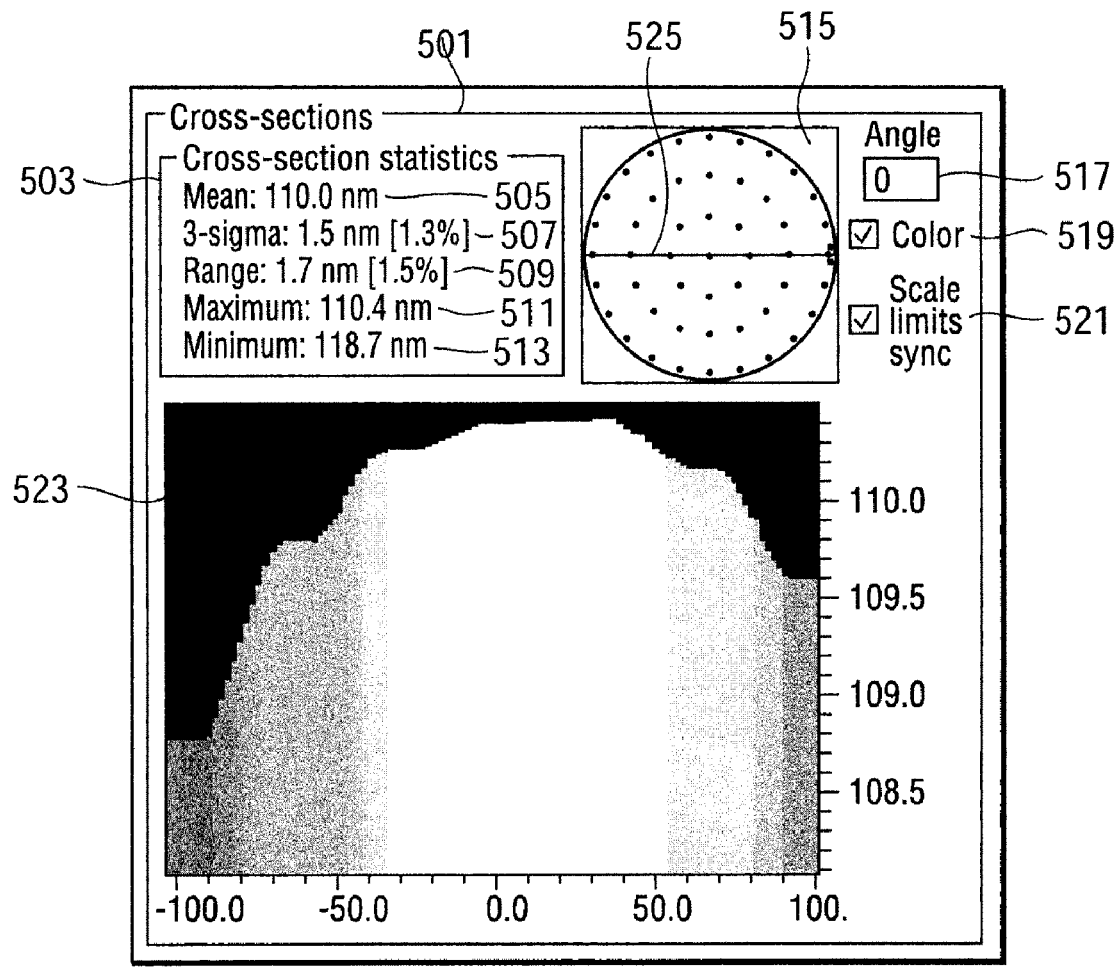
FIG. 5 is an illustration showing an isolated view of the cross-section area, in accordance with one embodiment of the present invention.

FIG. 5 is an illustration showing an isolated view of the cross-section area 501, in accordance with one embodiment of the present invention. The cross-section area 501 includes a cross-section display 523. The cross-section display 523 displays a cross-section traversing through a center of the wafer in accordance with a set of cross-section controls. The cross-section display 523 includes a horizontal scale representing the radial distance from the center of the wafer. The cross-section display 523 also includes a vertical scale representing a wafer thickness. Therefore, the cross-section display 523 presents an image of the wafer thickness variation as a function of distance from the wafer center.

The set of cross-section controls are provided to allow the user to select the exact cross-section to be displayed in the cross-section display 523. The set of cross-section controls include an angle select graphical control 515, an angle value field 517, a color selection 519, and a scale limits synchronization selection 521. The angle select graphical control 515 and the angle value field 517 can be used by the user to select the exact cross-section to be analyzed. The user can select and drag a cross-section control line 525 to obtain a desired cross-section for analysis. The cross-section control line 525 is defined to pivot about a center of the graphical control 515. Alternatively, the user can directly enter an angle in the angle value field 517 to obtain a desired cross-section for analysis. If the angle select graphical control 515 is used, the corresponding angle is displayed in the angle value field 517. If an angle value is entered directly in the angle value field 517, the angle select graphical control 515 adjusts to reflect the entered angle value. The color selection 519 is used to toggle between a color cross-section display 523 and line-graph type cross-section display 523. When the color selection 519 is activated, the color scale displayed in the wafer display area 201 is also used for the color cross-section display 523. The scale limits synchronization selection 521 is used to synchronize the vertical scale of the cross-section display 523 with the scale limits as entered in the scale limits area 251.

The cross-section area 501 also includes a cross-section statistics area 503. The cross-section statistics area 503 displays a mean value 505, a 3-sigma value 507 (i.e., three times the standard deviation about the mean), a range value 509 (i.e., difference between the maximum value and the minimum value), a maximum value 511, and a minimum value 513, corresponding to a currently selected and displayed cross-section as established by the set of cross-section controls.

Figure 6:
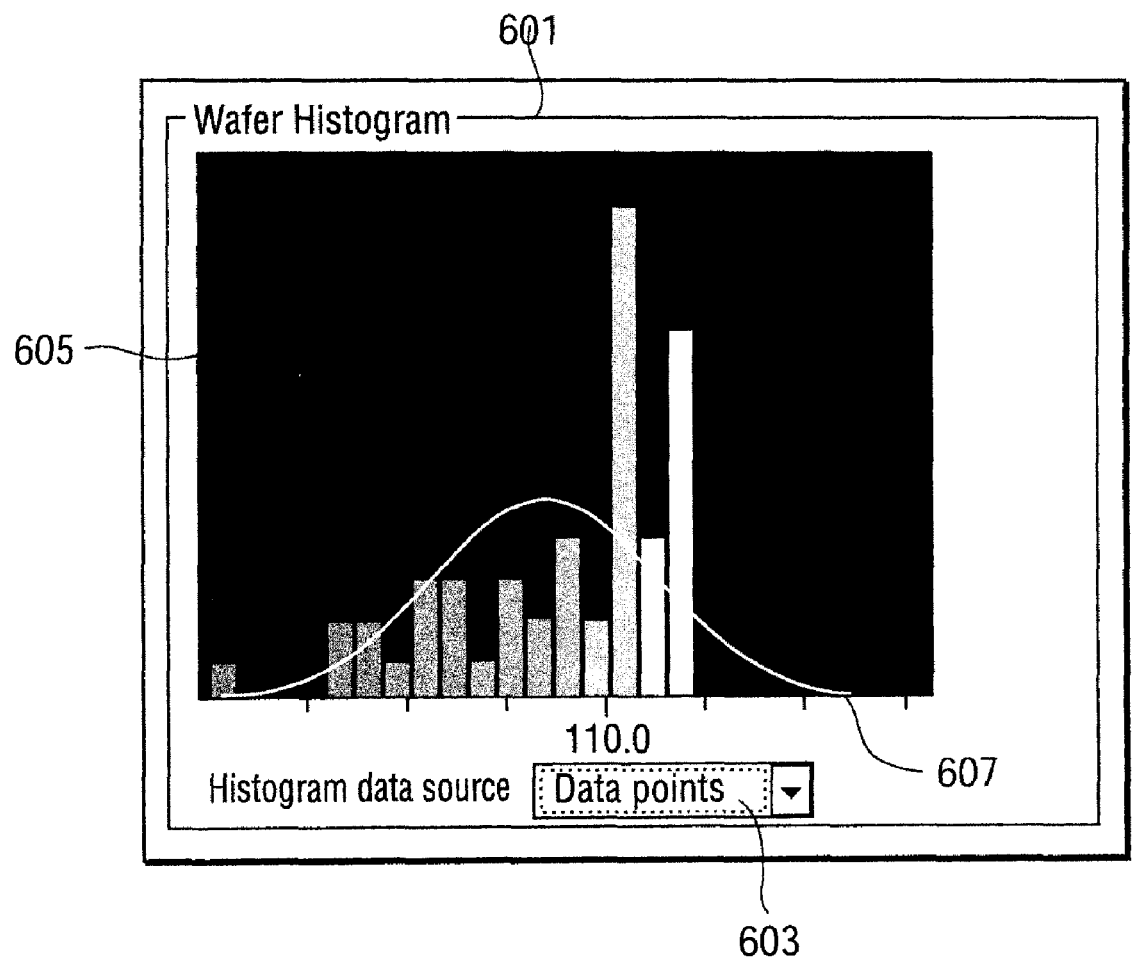
FIG. 6 is an illustration showing an isolated view of the histogram area, in accordance with one embodiment of the present invention.

FIG. 6 is an illustration showing an isolated view of the histogram area 601, in accordance with one embodiment of the present invention. The histogram area 601 includes a histogram display 605 and a histogram data source selection 603. The histogram display 605 can be used to evaluate a Gaussian nature of the currently selected and displayed wafer data values. The histogram display 605 includes a bar plot of the data values according to the current histogram data source selection 603. Each bar of the bar plot represents one quarter of the standard deviation about the mean. The histogram display 605 also shows an ideal Gaussian distribution 607 based on the mean and standard deviation of the current histogram data source selection 603. The histogram data source selection 603 offers a drop-down menu that allows the user to select a data source for generating the histogram display 605. In one embodiment, the histogram data source options include either the data values corresponding to the data measurement sites or the data values corresponding to the interpolation, where the interpolation is defined by the point density select field 233 and the interpolation select field 235.

Figure 7:
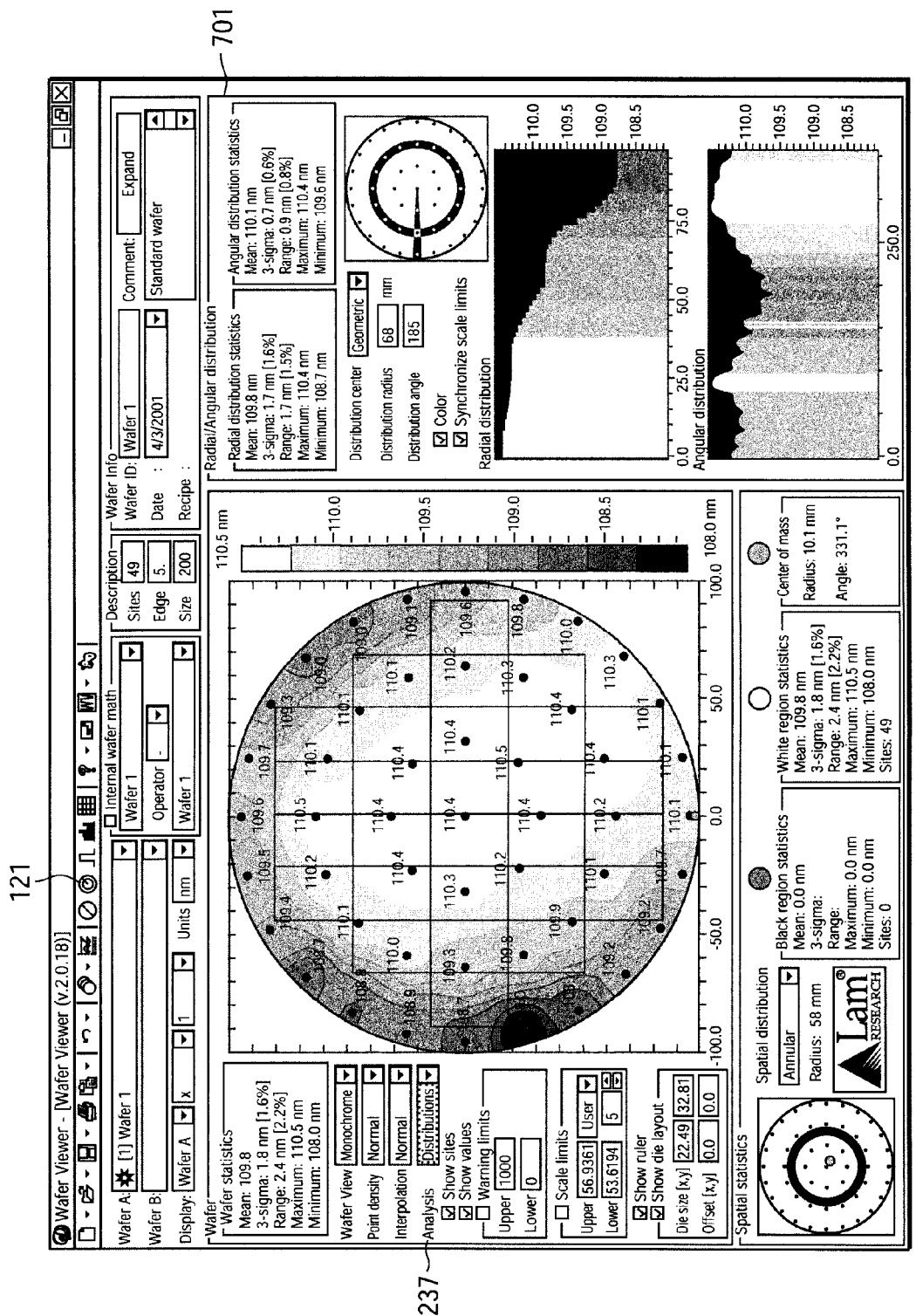
FIG. 7 is an illustration showing the GUI when the distribution analysis option is selected, in accordance with one embodiment of the present invention.

FIG. 7 is an illustration showing the GUI 10 when the distribution analysis option is selected, in accordance with one embodiment of the present invention. The distribution analysis option can be selected with either the analysis select field 237 or the azimuthal/radial distribution icon 121. Upon selection of the distribution analysis option, the GUI 10 displays a radial/angular distribution area 701.

Figure 8:
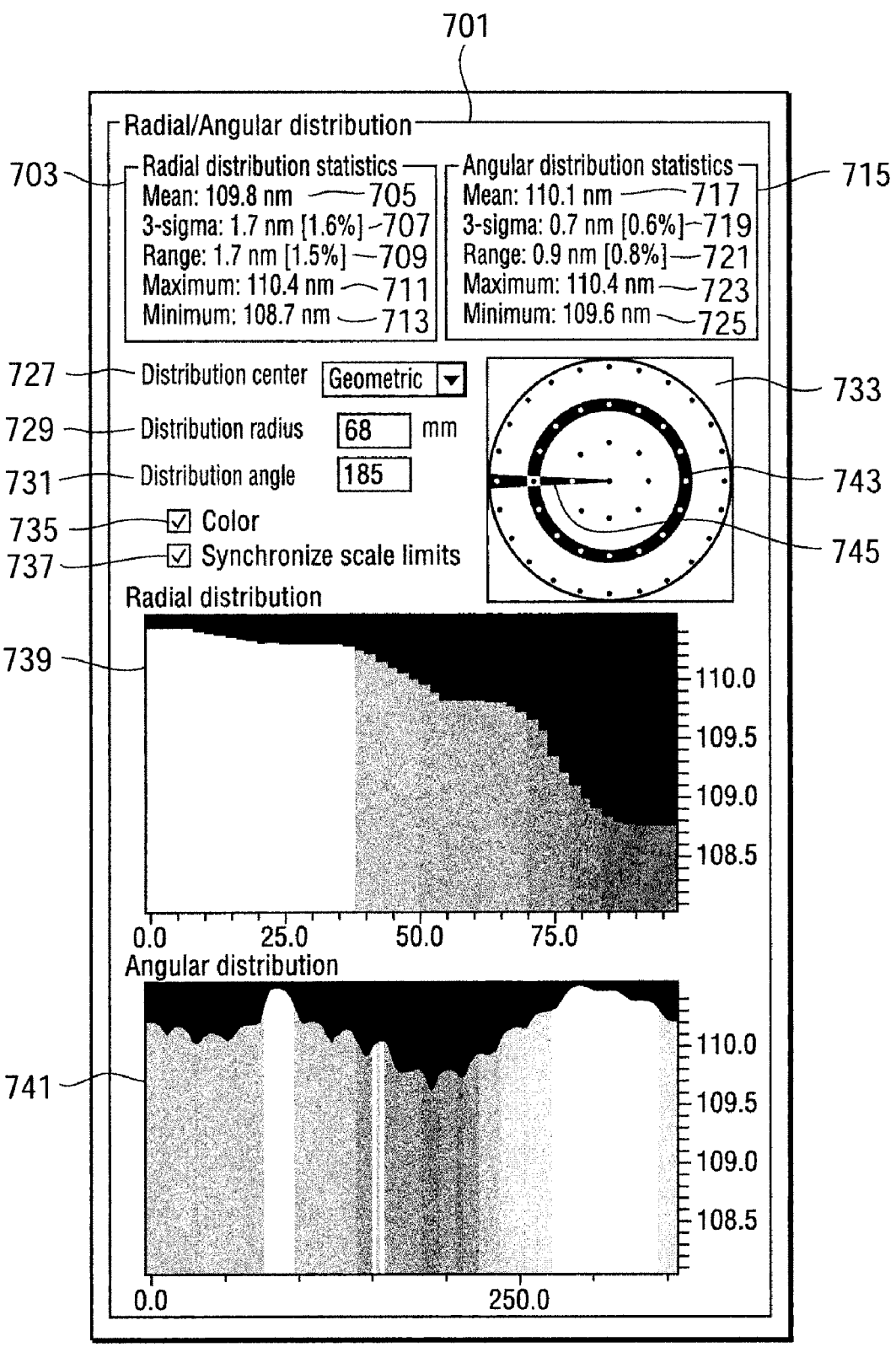
FIG. 8 is an illustration showing an isolated view of the radial/angular distribution area, in accordance with one embodiment of the present invention.

FIG. 8 is an illustration showing an isolated view of the radial/angular distribution area 701, in accordance with one embodiment of the present invention. The radial/angular distribution area 701 includes a radial distribution display 739, an angular distribution display 741, a set of radial and angular distribution display controls, a radial distribution statistics area 703, and an angular distribution statistics area 715.

The radial distribution display 739 presents a plot of wafer thickness from a distribution center to the edge of the wafer. A vertical scale of the radial distribution display 739 corresponds to the wafer thickness value. A horizontal scale of the radial distribution display 739 corresponds to the distance from the distribution center to the edge of the wafer. Through a distribution select field 727 in the set of radial and angular distribution display controls, the user can choose to set the distribution center at either a geometric center of the wafer or a center of mass of the wafer. Through a graphical distribution control 733 in the set of radial and angular distribution display controls, the user can select and drag a radial distribution control line 745 to obtain a desired radial distribution for analysis. The radial distribution control line 745 is defined to pivot about the distribution center selected in the distribution select field 727. Alternatively, the user can directly enter an angle in the angle value field 731 to obtain a desired radial distribution for analysis. If the radial distribution control line 745 is used, the corresponding angle is displayed in the angle value field 731. If the angle value is entered directly in the angle value field 731, the radial distribution control line 745 adjusts to reflect the entered angle value.

The angular distribution display 741 presents a plot of wafer thickness around an annular region of the wafer. A vertical scale of the angular distribution display 741 corresponds to the wafer thickness value. A horizontal scale of the angular distribution display 741 corresponds to an angular distance (i.e., 0 degrees to 360 degrees) from a starting point about a distribution center. Through the distribution select field 727, the user can choose to set the distribution center at either the geometric center of the wafer or the center of mass of the wafer. Through the graphical distribution control 733, the user can select and drag an annular distribution control line 743 to obtain a desired annular distribution radius for analysis. The annular distribution control line 743 is defined to be radially adjusted about the distribution center selected in the distribution select field 727. Alternatively, the user can directly enter a radius in the radius value field 729 to obtain a desired annular distribution for analysis. If the annular distribution control line 743 is used, the corresponding radius is displayed in the radius value field 729. If the radius value is entered directly in the radius value field 729, the annular distribution control line 743 adjusts to reflect the entered radius value.

A color selection 735 is used to toggle between a color version and a line-graph version of the radial distribution display 739 and the angular distribution display 741. When the color selection 735 is activated, the color scale displayed in the wafer display area 201 is also used for the color version of the radial distribution display 739 and the angular distribution display 741. Also, a scale limits synchronization selection 737 is used to synchronize the vertical scales of both the radial distribution display 739 and the angular distribution display 741 with the scale limits as entered in the scale limits area 251.

The radial distribution statistics area 703 displays a mean value 705, a 3-sigma value 707 (i.e., three times the standard deviation about the mean), a range value 709 (i.e., difference between the maximum value and the minimum value), a maximum value 711, and a minimum value 713, corresponding to a currently selected and displayed radial distribution as established by the set of radial and angular distribution display controls. Similarly, the angular distribution statistics area 715 displays a mean value 717, a 3-sigma value 719 (i.e., three times the standard deviation about the mean), a range value 721 (i.e., difference between the maximum value and the minimum value), a maximum value 723, and a minimum value 725, corresponding to a currently selected and displayed angular distribution as established by the set of radial and angular distribution display controls. The radial distribution display 739 and the radial distribution statistics area 703 are useful for evaluating non-uniformities at a constant angle across the wafer from either the wafer geometric center or the wafer center of mass. The angular distribution display 741 and the angular distribution statistics area 715 are useful for evaluating non-uniformities at a constant distance from either the wafer geometric center or the wafer center of mass.

Figure 9:
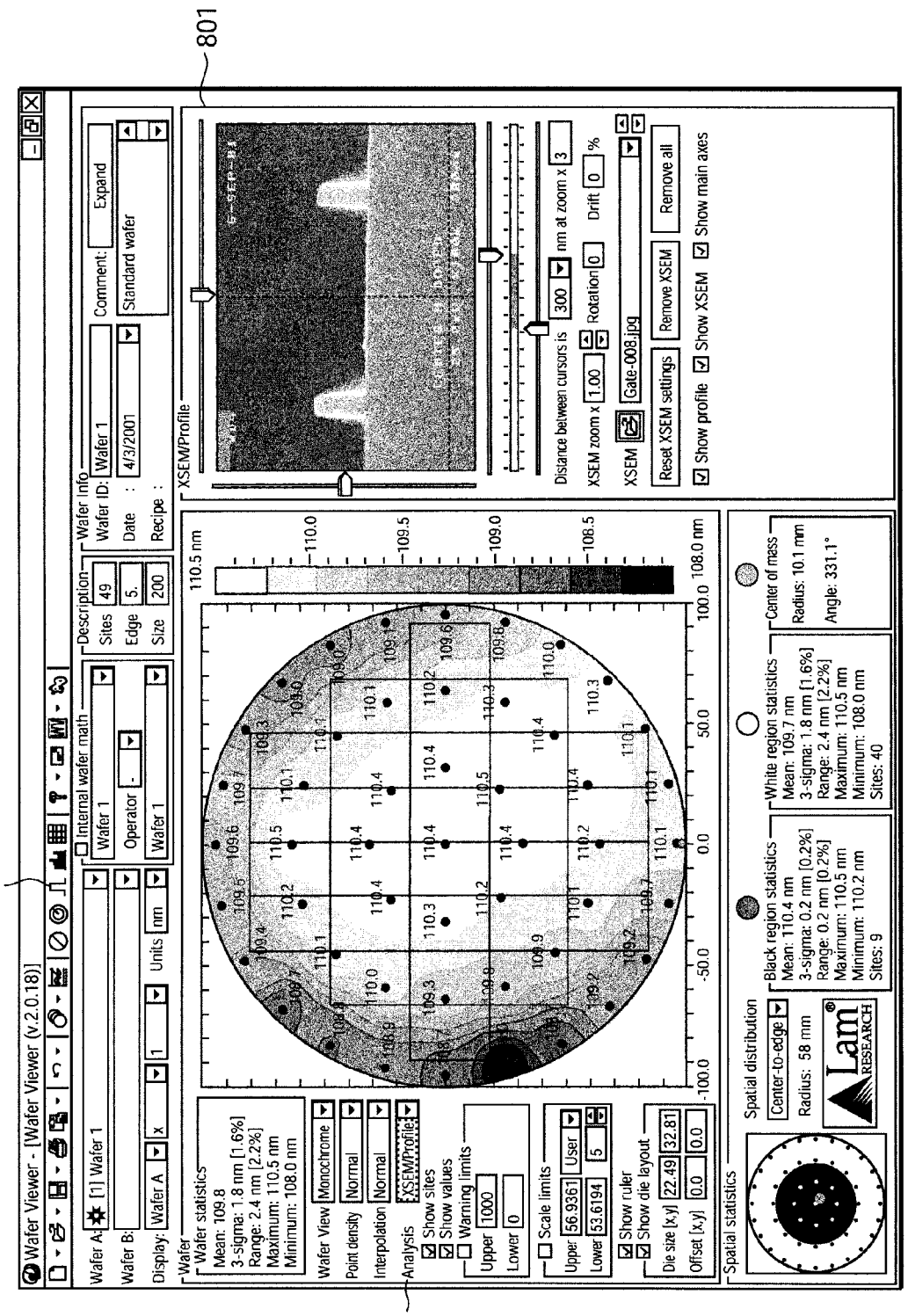
FIG. 9 is an illustration showing the GUI when the XSEM/profile analysis option is selected, in accordance with one embodiment of the present invention.

FIG. 9 is an illustration showing the GUI 10 when the XSEM/profile analysis option is selected (XSEM is a cross-section scan electronic microscope image), in accordance with one embodiment of the present invention. The XSEM/profile analysis option can be selected with either the analysis select field 237 or the XSEM/profile icon 123. Upon selection of the XSEM/profile analysis option, the GUI 10 displays an XSEM/profile area 801.

Figure 10:
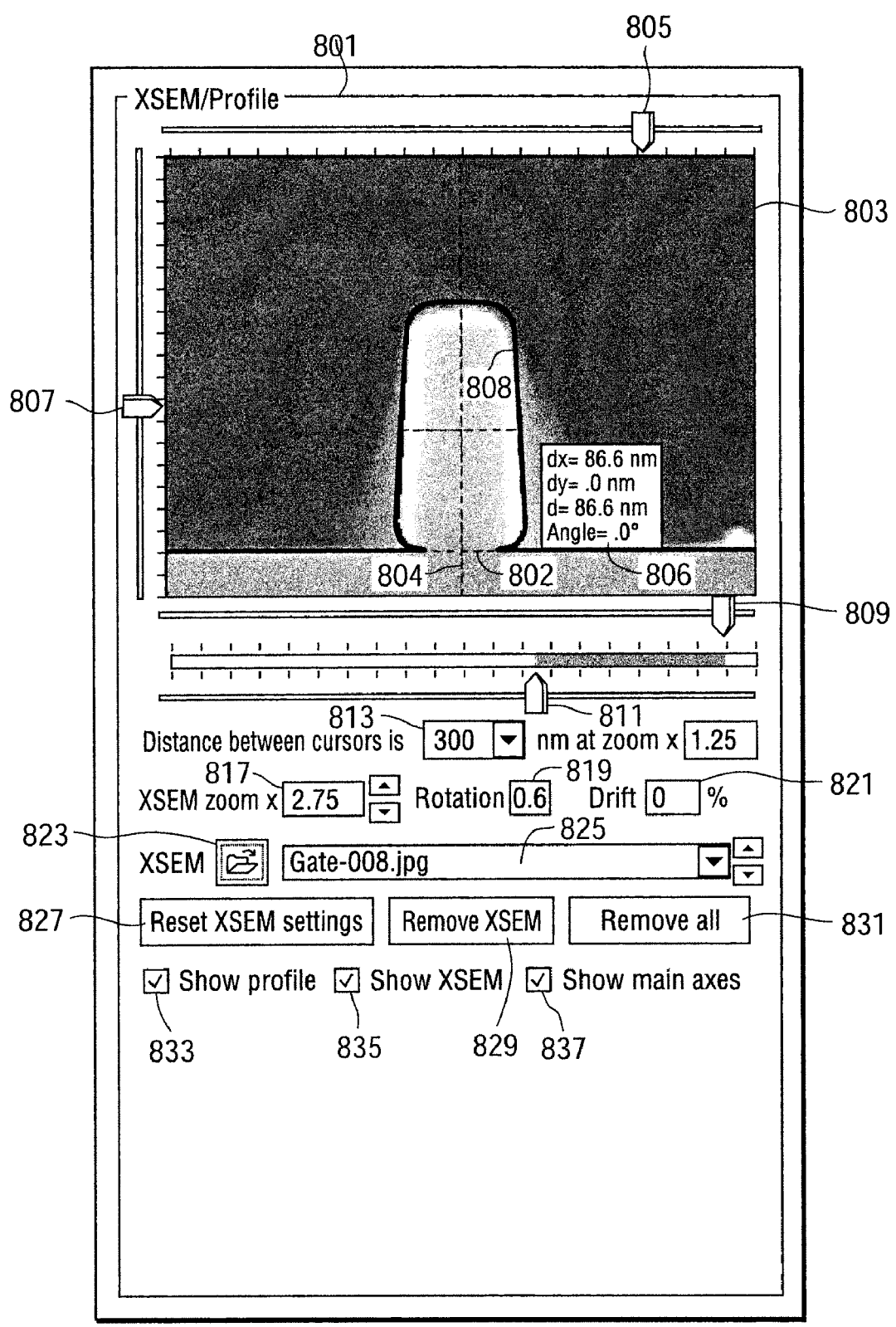
FIG. 10 is an illustration showing an isolated view of the XSEM/profile area, in accordance with one embodiment of the present invention.

FIG. 10 is an illustration showing an isolated view of the XSEM/profile area 801, in accordance with one embodiment of the present invention. An XSEM/profile display area 803 is provided within the XSEM/profile area 801. The user can open an XSEM or profile picture by using either the load data/XSEM icon 105 in the menu bar 101 or an open file icon 823 in the XSEM/profile area 801. A filename field 825 is provided to show a filename of the picture currently displayed in the XSEM/profile display area 803. The filename field 825 also offers a drop-down menu to allow the user to quickly select another picture currently stored in memory to be displayed in the XSEM/profile display area 803.

A zoom select field 817 is provided to allow the user to select a size amplification of the picture currently displayed in the XSEM/profile display area 803. In one embodiment, the zoom select field 817 can be used to amplify the displayed picture up to 4 times its original size. A rotation select field 819 is provided to allow the user to rotate the picture currently displayed in the XSEM/profile display area 803. The rotation select field 819 is useful for correcting angle errors that may have occurred during a capture of the currently displayed picture. A drift select field 821 is provided to allow the user to correct distortions that may have occurred during a capture of the currently displayed picture. For example, the drift select field 821 is useful for correcting distortion caused by stage movement during electron beam scanning when capturing the currently displayed picture. A horizontal slider 805 and a vertical slider 807 are provided to allow a user to shift the currently displayed picture left, right, up, and down. The horizontal slider 805 and the vertical slider 807 are useful for centering a target feature when the zoom is amplifying the size of the currently displayed picture. A reset XSEM settings button 827 is provided to allow the user to reset the horizontal slider 805, the vertical slider 807, the zoom select field 817, the rotation select field 819, and the drift select field 821 to default values. A remove XSEM button 829 is provided to allow the user to remove the currently displayed picture from memory. A remove all button 831 is provided to allow the user to remove all pictures currently stored in memory to be displayed in the XSEM/profile display area 803. A show profile selection 833 is provided to allow the user to quickly show and remove a currently selected profile picture. A show XSEM selection 835 is provided to allow the user to quickly show and remove a currently selected XSEM picture. A show main axes selection 837 is provided to allow the user to display and remove a horizontal axis 802 and a vertical axis 804 from the XSEM/profile display area 803.

A first calibration slider 809 and a second calibration slider 811 are used to calibrate a scale for measuring distances within the XSEM/profile display area 803. A calibration distance select field 813 is provided to allow the user to assign a value to a distance between the first calibration slider 809 and the second calibration slider 811. After calibration, the user can position the mouse pointer within the XSEM/profile display area 803 to obtain a set of cartesian coordinates corresponding to the mouse pointer position relative to the horizontal axis and vertical axis as presented by the show main axes selection 837. The set of cartesian coordinates are displayed in a label area 806 next to the mouse pointer position. The user can click the mouse pointer to select a starting location of a distance measurement. Keeping the mouse pointer pressed, the user can move the mouse pointer to an ending location of the distance measurement. The label area 806 displayed next to the mouse pointer position will display a horizontal distance value, a vertical distance value, a straight-line distance value, and an angle value between the straight-line distance direction and the horizontal and vertical axes. The calculated distances displayed in the label area 806 correspond to the calibration established using the first calibration slider 809, the second calibration slider 811, and the calibration distance select field 813. Additionally, the user can drop a marker set of lines at a desired location in the XSEM/profile display area 803 by double-clicking the mouse pointer at the desired location. In one embodiment, the XSEM/profile analysis option allow the user to overlay a profile 808 created using profile parameter results over a XSEM picture displayed in the XSEM/profile display area 803. As previously mentioned, the profile 808 display can be toggled on and off using the show profile selection 833.

Figure 11:
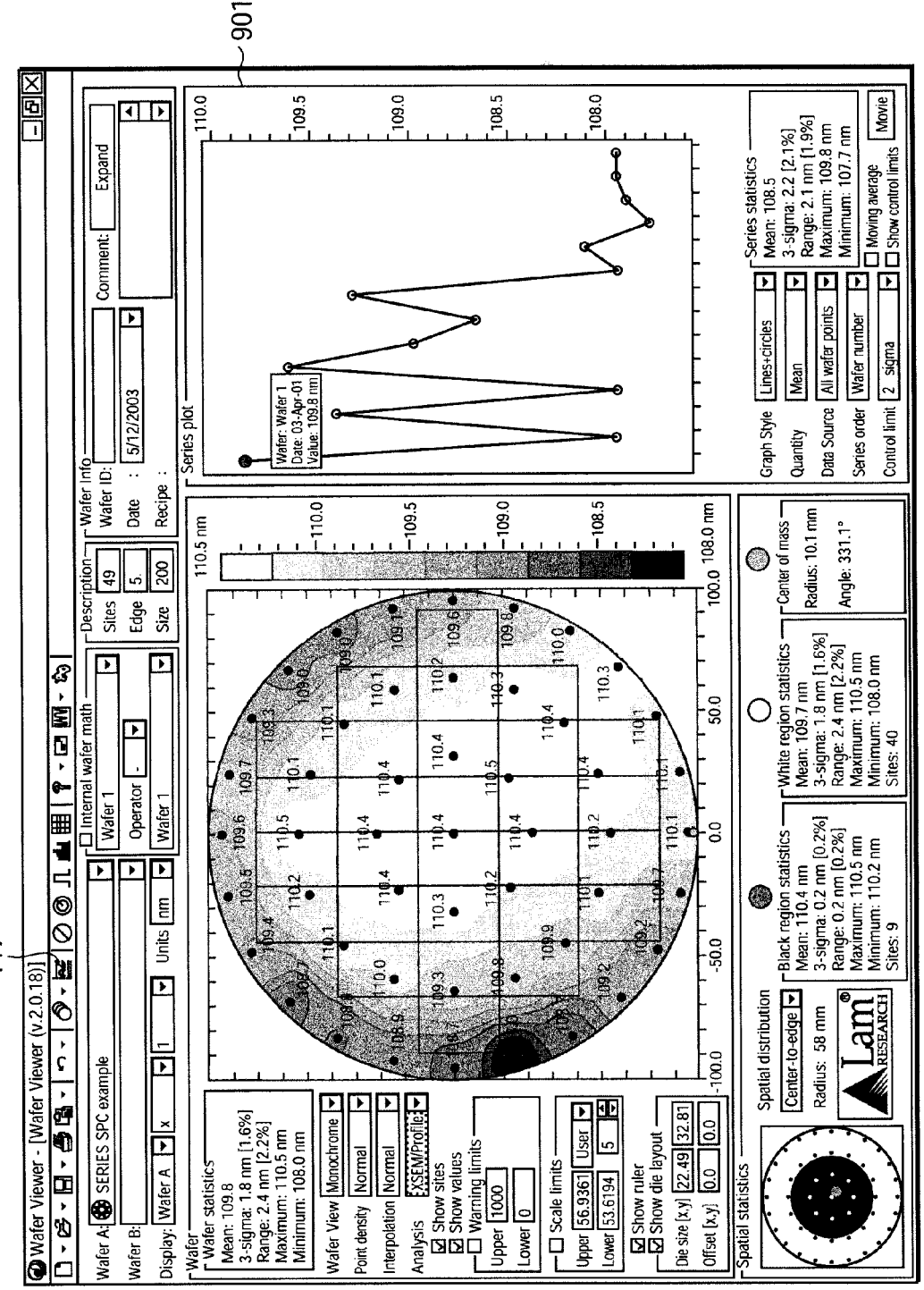
FIG. 11 is an illustration showing the GUI when a series analysis option is selected, in accordance with one embodiment of the present invention.

FIG. 11 is an illustration showing the GUI 10 when a series analysis option is selected, in accordance with one embodiment of the present invention. The series analysis option can be selected with the series analysis icon 117. Upon selection of the series analysis option, the GUI 10 displays a series plot area 901.

Figure 12:
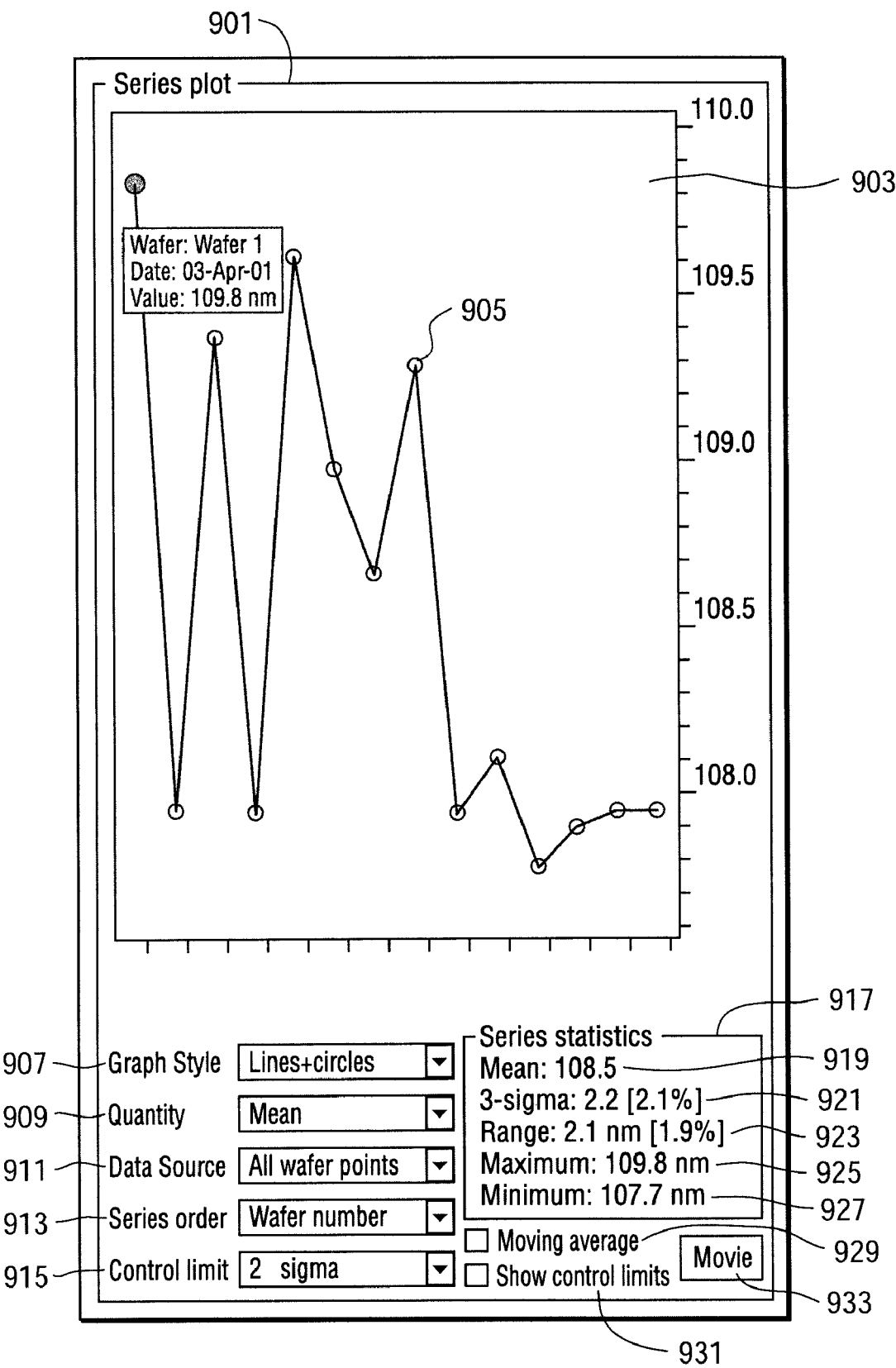
FIG. 12 is an illustration showing an isolated view of the series plot area, in accordance with one embodiment of the present invention.

FIG. 12 is an illustration showing an isolated view of the series plot area 901, in accordance with one embodiment of the present invention. As previously discussed with respect to the wafer collection management icon 115, a wafer collection represents a collection of multiple data sets for a number of wafers that have a common pattern of data measurement sites. Depending on the wafer processes run, the wafer collection could represent a process library, a statistical process control (SPC) series, or a tool matching series, among others. In the process library, the collection of multiple data sets represents results in different process conditions. In the SPC series, the collection of multiple data sets represents results obtained for the same process in the same tool at different times. In the tool matching series, the collection of multiple data sets represents results of the same process in different tools.

The data set for each wafer in the wafer collection can be separately displayed and analyzed. Also, spatially resolved statistics can be calculated for the collection of multiple data sets. In one embodiment, an average wafer data set is calculated based on the collection of multiple data sets. The average wafer data set can be displayed and analyzed. Also, a 3-sigma value wafer data set, a range value wafer data set, a maximum value data set, and a minimum value data set is calculated based on the collection of multiple data sets and can be displayed and analyzed.

The series plot area 901 displays information related to the currently loaded wafer collection. The series plot area 901 includes a series plot display 903 of a number of data values 905 for each wafer in the wafer collection. The series plot display 903 is rendered according to a graph style selection 907, a quantity selection 909, a data source selection 911, and a series order selection 913. The series plot display 903 presents a plot of the quantity selection 909 for each wafer in the wafer collection. The quantity selection 909 offers a drop-down menu to allow the user to select either a mean value, a 3-sigma value (i.e., three times the standard deviation about the mean), a range value (i.e., difference between the maximum value and the minimum value), a maximum value, or a minimum value. The series order selection 913 offers a drop-down menu to allow the user to select either a wafer number or a wafer date for ordering of the wafers in the series plot display 903. The graph style selection 907 offers a drop-down menu to allow the user to select either a lines+circles format, a lines format, a circles format, or a bars format for the series plot display 903. Furthermore, the data source selection 911 offers a drop-down menu to allow the user to select a group of data points for use in calculating the value selected in the quantity selection 909. In one embodiment, the group of data points can be either all wafer data points, a spatial black region in the spatial statistics area 301, or a spatial white region in the spatial statistics area 301. The spatial black and white regions in the spatial statistics area 301 are described below with respect to the spatial statistics area 301.

A show control limits selection 931 is provided to allow the user to display a control limit on the series plot display 903. A control limit selection 915 offers the user a drop-down menu for selecting the control limit. In one embodiment, control limit options include 1.5, 2, 2.5, 3, 3.5, and 4 sigma (i.e., standard deviations about the mean). A show moving average selection 929 is also provided to allow the user to display moving averages of the mean and the selected control limit about the mean, on the series plot display 903.

In one embodiment, the user can select a wafer from the series plot display 903 and have the corresponding wafer data set be displayed in the wafer display window 215. In another embodiment, the user can activate a movie button 933 in the series plot area 901 to cause each wafer data set in the wafer collection to be automatically and sequentially displayed in the wafer display window 215.

The series plot area 901 also includes a series statistics area 917. The series statistics area 917 displays a mean value 919, a 3-sigma value 921 (i.e., three times the standard deviation about the mean), a range value 923 (i.e., difference between the maximum value and the minimum value), a maximum value 925, and a minimum value 927, corresponding to the currently loaded wafer collection and data source selection 911.

Figure 13:
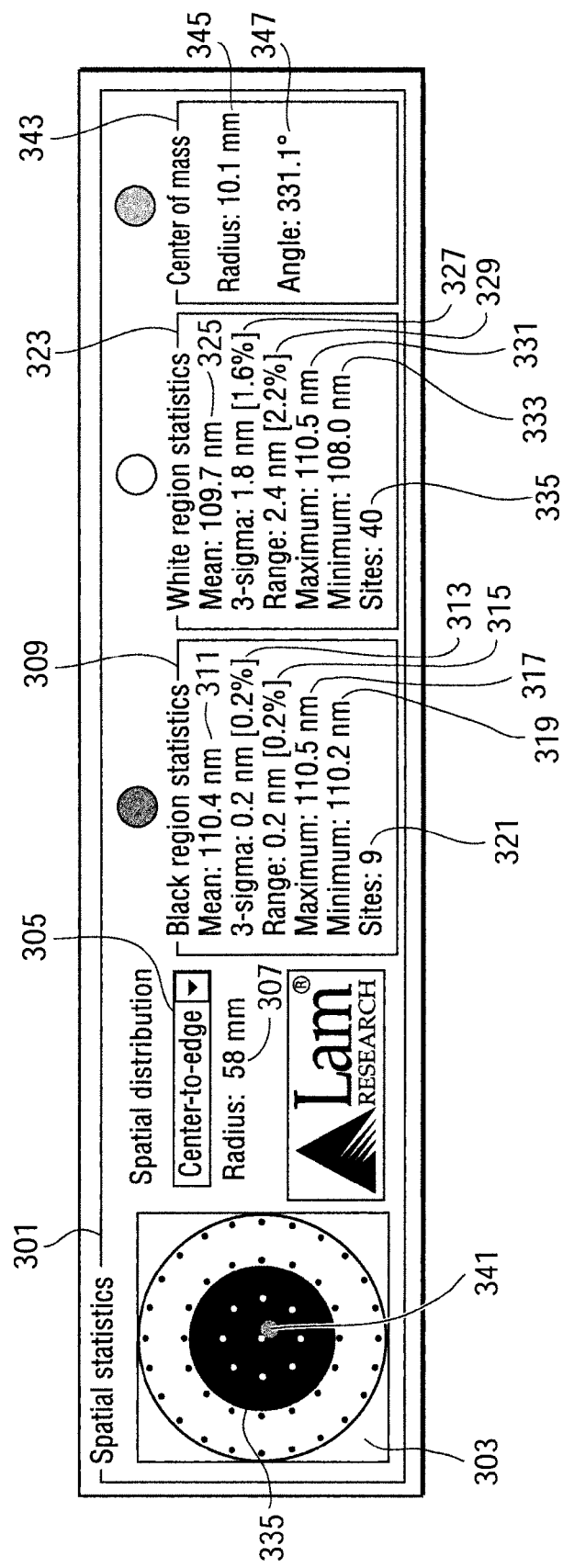
FIG. 13 is an illustration showing an isolated view of the spatial statistics area, in accordance with one embodiment of the present invention.

FIG. 13 is an illustration showing an isolated view of the spatial statistics area 301, in accordance with one embodiment of the present invention. The spatial statistics area 301 includes a spatial control 303 for graphically selecting an area of the wafer to be statistically analyzed. A spatial distribution selection 305 offers the user a drop-down menu for selecting a type of spatial distribution to be used in the spatial control 303. In one embodiment, a center-to-edge spatial distribution is offered to the user. Selection of the center-to-edge spatial distribution allows the user to select and drag a control line 335 to obtain a desired center-to-edge area for analysis. The center-to-edge area is defined to extend outward from the center of the wafer to the control line 335 position. The center-to-edge area is called a black region for statistical analysis purposes. A balance of the wafer area beyond the center-to-edge area is called a white region for statistical analysis purposes. The center-to-edge embodiment further includes a radius display field 307 for displaying a radial distance from the wafer center at which the control line 335 is positioned.

In general, a set of data measurement points $z_i$ are provided at locations $(x_i, y_i)$ across a wafer defined by $x^2+y^2<=R^2$, where R is the radius of the wafer. Whole wafer statistics are based on inclusion of all points $z_i$. As an alternative, the spatial control 303 allows the user to obtain statistics for sub-regions (i.e., the black region and the white region) of the wafer. Statistics for each of the sub-regions are calculated based on inclusion of only the data points $z_i$ within the respective sub-region. Description of the spatial control 303 and its use to obtain statistics for sub-regions of the wafer is provided in co-pending patent application entitled "User Interface for Quantifying Wafer Non-Uniformities and Graphically Explore Significance", having U.S. patent application Ser. No. 10/331,194, which is incorporated herein by reference.

The spatial statistics area 301 further includes a black region statistics area 309. The black region statistics area 309 displays a mean value 311, a 3-sigma value 313 (i.e., three times the standard deviation about the mean), a range value 315 (i.e., difference between the maximum value and the minimum value), a maximum value 317, and a minimum value 319, corresponding to the black region associated with a currently selected center-to-edge area. Additionally, the black region statistics area 309 includes a sites display 321 for presenting a number of data measurement sites included in the selected black region. The statistics presented in the black region statistics area 309 are automatically recalculated as the user adjusts the control line 335 defining the selected center-to-edge area.

The spatial statistics area 301 further includes a white region statistics area 323. The white region statistics area 323 displays a mean value 325, a 3-sigma value 327 (i.e., three times the standard deviation about the mean), a range value 329 (i.e., difference between the maximum value and the minimum value), a maximum value 331, and a minimum value 333, corresponding to the white region associated with a currently selected center-to-edge area. Additionally, the white region statistics area 323 includes a sites display 335 for presenting a number of data measurement sites included in the selected white region. The statistics presented in the white region statistics area 323 are automatically recalculated as the user adjusts the control line 335 defining the selected center-to-edge area.

The spatial statistics area 301 further includes a center of mass area 343. The center of mass area 343 displays a set of polar coordinates corresponding to the center of mass of the wafer. The set of polar coordinates includes a radius display 345 and an angle display 347 for identifying the center of mass location of the wafer. A center of mass indicator 341 is also displayed in the spatial control 303. Calculation of the center of mass and description of its usefulness for analysis is provided in co-pending patent application entitled "System and Method for Quantifying Uniformity Patterns for tool Development and Monitoring", having U.S. patent application Ser. No. 10/327,233, which is incorporated herein by reference.

Figure 14:
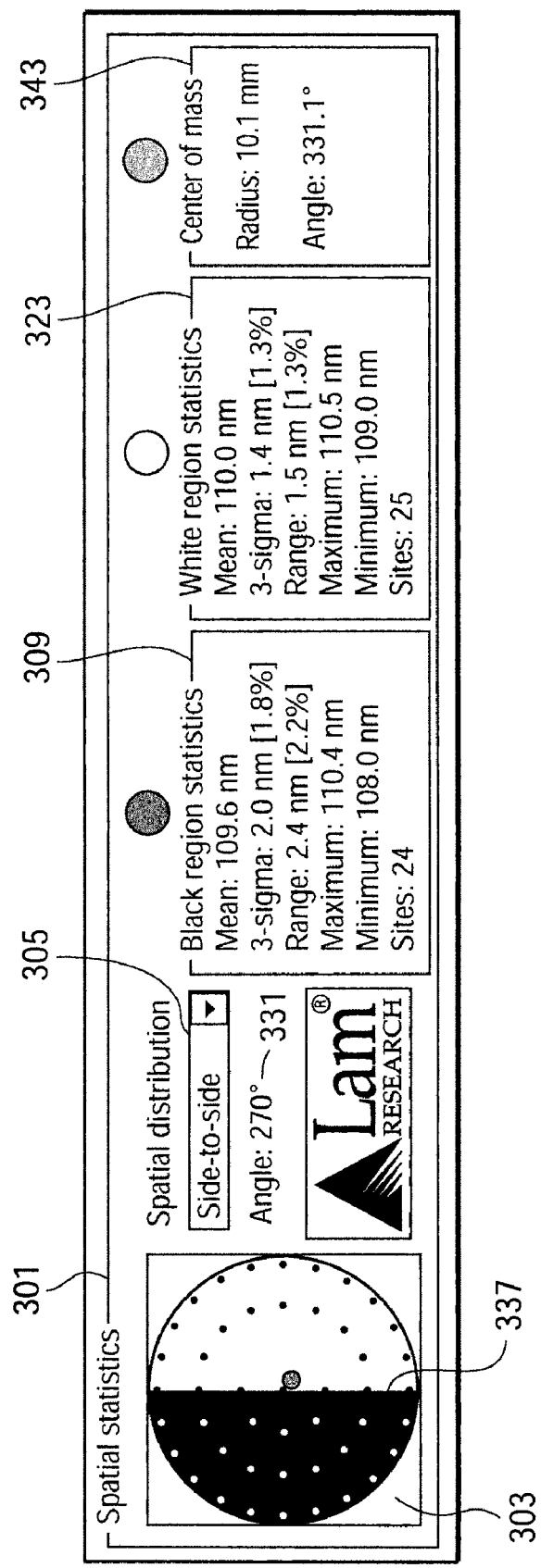
FIG. 14 is an illustration showing an isolated view of the spatial statistics area with a side-to-side spatial distribution selection, in accordance with one embodiment of the present invention.

FIG. 14 is an illustration showing an isolated view of the spatial statistics area 301 with a side-to-side spatial distribution selection, in accordance with one embodiment of the present invention. In the embodiment of FIG. 14, the side-to-side spatial distribution is selected in the spatial distribution selection 305. Selection of the side-to-side spatial distribution changes the spatial control 303 to a side-to-side control. The side-to-side control allows the user to select and drag a control line 337 to obtain a desired area for analysis. The side-to-side area is defined to cover one-half of the wafer with a boundary extending through the center of the wafer. By adjusting the control line 337, the user can rotate the side-to-side area about the center of the wafer. Values presented in the black region statistics area 309 correspond to the selected side-to-side area. Values presented in the white region statistics area 323 correspond to the complement of the selected side-to-side area. The side-to-side embodiment further includes an angle display field 331 for displaying an angle about the wafer center at which the control line 337 is positioned. Also in the side-to-side embodiment, the center of mass area 343 displays the set of polar coordinates corresponding to the center of mass of the wafer.

Figure 15:
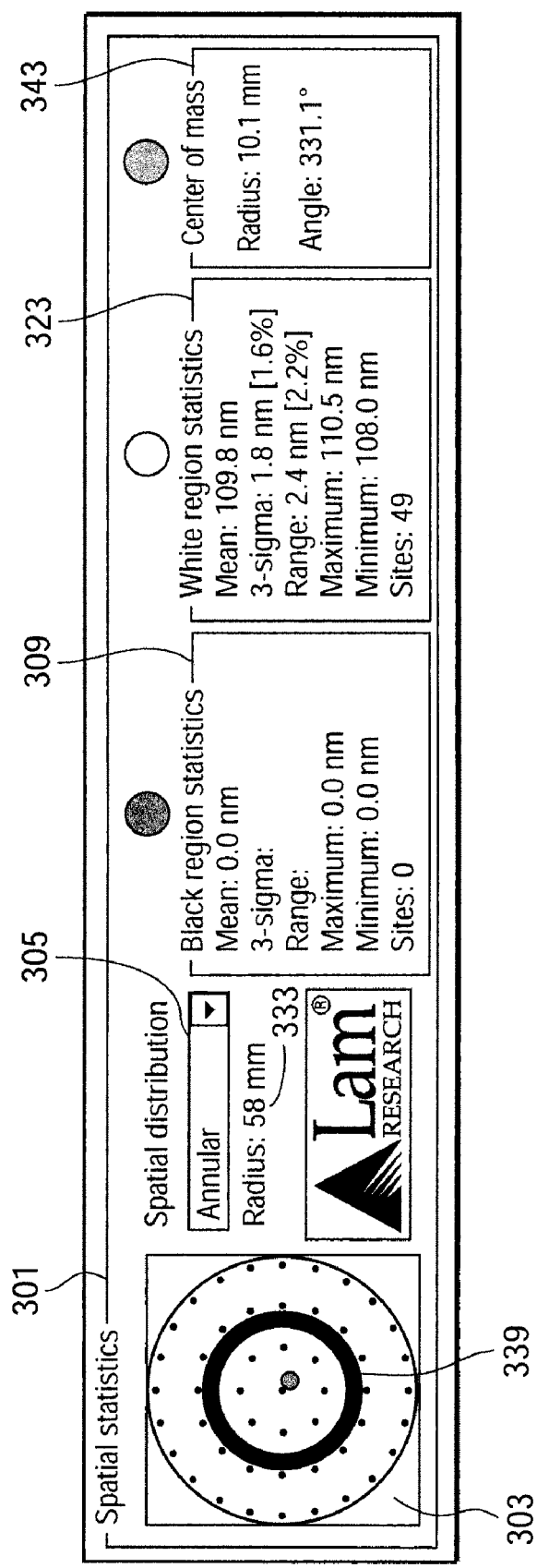
FIG. 15 is an illustration showing an isolated view of the spatial statistics area with an annular spatial distribution selection, in accordance with one embodiment of the present invention.

FIG. 15 is an illustration showing an isolated view of the spatial statistics area 301 with an annular spatial distribution selection, in accordance with one embodiment of the present invention. In the embodiment of FIG. 15, the annular spatial distribution is selected in the spatial distribution selection 305. Selection of the annular spatial distribution changes the spatial control 303 to an annular control. The annular control allows the user to select and drag a control line 339 to obtain a desired annular area for analysis. The annular area is defined as a ring about the center of the wafer. By adjusting the control line 339, the user can move the annular area toward or away from the center of the wafer. Values presented in the black region statistics area 309 correspond to the selected annular area. Values presented in the white region statistics area 323 correspond to the complement of the selected annular area. The annular embodiment further includes an radius display field 333 for displaying a radial distance from the wafer center at which the control line 339 is positioned. Also in the annular embodiment, the center of mass area 343 displays the set of polar coordinates corresponding to the center of mass of the wafer.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for generating a graphical user interface on a display of a computer system for performing a profile analysis, comprising:
    displaying an electronic microscope image in the graphical user interface on the display;
    providing controls in the graphical user interface on the display for adjusting the electronic microscope image;
    providing a graphical measurement control in the graphical user interface on the display; and
    providing controls in the graphical user interface on the display for calibrating the graphical measurement control, wherein the controls for calibrating the graphical measurement control include a first calibration slider and a second calibration slider, and a calibration distribution select field to enable user assignment of a distance value to a displayed distance between the first and second calibration sliders, wherein the first and second calibration sliders are displayed in the graphical user interface along an edge of the displayed electronic microscope image, and wherein the first and second calibration sliders are independently movable in a linearly constrained manner along the edge of the displayed electronic microscope image.

2. A method for generating a graphical user interface on a display of a computer system for performing a profile analysis as recited in claim 1, further comprising:
    providing a graphical pointer in the graphical user interface on the display to obtain cartesian coordinates relative to main axes based on the distance value assigned to the displayed distance between the first and second calibration sliders.

3. A method for generating a graphical user interface on a display of a computer system for performing a profile analysis as recited in claim 1, further comprising:
    displaying a profile over the electronic microscope image in the graphical user interface on the display.

4. A method for generating a graphical user interface on a display of a computer system for performing a profile analysis as recited in claim 1, wherein the controls for adjusting the electronic microscope image includes an image zoom control and an image position control.

5. A method for generating a graphical user interface on a display of a computer system for performing a profile analysis as recited in claim 1, wherein the controls for adjusting the electronic microscope image includes a rotation select field to enable rotation of the electronic microscope image.

6. A method for generating a graphical user interface on a display of a computer system for performing a profile analysis as recited in claim 1, wherein the controls for adjusting the electronic microscope image includes a drift select field to enable correction of distortions in the electronic microscope image.

7. A data storage device for storing data to be read by a computer system including program instructions for providing a graphical user interface for performing a profile analysis, comprising:
    program instructions for displaying an electronic microscope image;
    program instructions for providing controls for adjusting the electronic microscope image;
    program instructions for providing a graphical measurement control; and
    program instructions for providing controls for calibrating the graphical measurement control, wherein the controls for calibrating the graphical measurement control include a first calibration slider and a second calibration slider, and a calibration distribution select field to enable user assignment of a distance value to a displayed distance between the first and second calibration sliders, wherein the first and second calibration sliders are displayed in the graphical user interface along an edge of the displayed electronic microscope image, and wherein the first and second calibration sliders are independently movable in a linearly constrained manner along the edge of the displayed electronic microscope image.

8. A data storage device for storing data to be read by a computer system including program instructions for providing a graphical user interface for performing a profile analysis as recited in claim 7, further comprising:
program instructions for providing a graphical pointer to obtain cartesian coordinates relative to main axes based on the distance value assigned to the displayed distance between the first and second calibration sliders.

9. A data storage device for storing data to be read by a computer system including program instructions for providing a graphical user interface for performing a profile analysis as recited in claim 7, further comprising:
program instructions for displaying a profile over the electronic microscope image.

10. A data storage device for storing data to be read by a computer system including program instructions for providing a graphical user interface for performing a profile analysis as recited in claim 7, wherein the controls for adjusting the electronic microscope image includes an image zoom control and an image position control.

11. A data storage device for storing data to be read by a computer system including program instructions for providing a graphical user interface for performing a profile analysis as recited in claim 7, wherein the controls for adjusting the electronic microscope image includes a rotation select field to enable rotation of the electronic microscope image.

12. A data storage device for storing data to be read by a computer system including program instructions for providing a graphical user interface for performing a profile analysis as recited in claim 7, wherein the controls for adjusting the electronic microscope image includes a drift select field to enable correction of distortions in the electronic microscope image.

* * * * *